US012793779B2

(12) United States Patent
Wan et al.

(10) Patent No.: US 12,793,779 B2

(45) Date of Patent: Nov. 10, 2026

(54) MULTI-PASS PROGRAMMING IN MEMORY DEVICES

(71) Applicant: Yangtze Memory Technologies Co., Ltd., Wuhan (CN)

(72) Inventors: Weijun Wan, Wuhan (CN); Yue Sheng, Wuhan (CN); Zhipeng Dong, Wuhan (CN); Weihua Shi, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 253 days.

(21) Appl. No.: 18/639,928

(22) Filed: Apr. 18, 2024

(65) Prior Publication Data

US 2025/0308593 A1 Oct. 2, 2025

(30) Foreign Application Priority Data

Mar. 28, 2024 (CN) ......................... 202410372170.6

(51) Int. Cl.

| | |
|---|---|
| ***G11C 11/56*** | (2006.01) |
| ***G11C 16/10*** | (2006.01) |
| ***G11C 16/26*** | (2006.01) |
| *G11C 16/04* | (2006.01) |
| *G11C 16/08* | (2006.01) |

(52) U.S. Cl.

CPC .............. *G11C 16/10* (2013.01); *G11C 16/26* (2013.01); *G11C 11/56* (2013.01); *G11C 16/0483* (2013.01); *G11C 16/08* (2013.01)

(58) Field of Classification Search

CPC ...................................................... G11C 16/08

See application file for complete search history.

(56) References Cited

U.S. PATENT DOCUMENTS

2022/0415418 A1 * 12/2022 Chu .................... G11C 11/5628

* cited by examiner

*Primary Examiner* — Jason Lappas

(74) *Attorney, Agent, or Firm* — Hanley, Flight & Zimmerman, LLC

(57) ABSTRACT

Example memory devices, systems, and methods for multi-pass programming in memory devices are disclosed. One example method includes generating level indicator data based on first data, where the first data is to be stored in a memory device based on a first programming operation and a second programming operation. A programming operation is performed to store the level indicator data in a first cell of a memory cell array of the memory device. The first programming operation is performed to store the first data in a second cell of the memory cell array of the memory device.

19 Claims, 10 Drawing Sheets

| GRAY CODE | | | | | | | | | | | | | | | | |
|---|---|---|---|---|---|---|---|---|---|---|---|---|---|---|---|---|
| | LV0 | LV1 | LV2 | LV3 | LV4 | LV5 | LV6 | LV7 | LV8 | LV9 | LV10 | LV11 | LV12 | LV13 | LV14 | LV15 |
| LP | 1 | 1 | 0 | 0 | 0 | 0 | 0 | 0 | 1 | 1 | 1 | 1 | 1 | 1 | 0 | 0 |
| MP | 1 | 1 | 1 | 1 | 1 | 0 | 0 | 0 | 0 | 0 | 1 | 1 | 0 | 0 | 0 | 1 |
| UP | 1 | 1 | 1 | 0 | 0 | 0 | 0 | 1 | 1 | 0 | 0 | 0 | 0 | 1 | 1 | 1 |
| XP | 1 | 0 | 0 | 0 | 1 | 1 | 0 | 0 | 0 | 0 | 0 | 1 | 1 | 1 | 1 | 1 |
| DL (LEVEL INDICATOR) | 0 | 1 | 0 | 1 | 0 | 1 | 0 | 1 | 0 | 1 | 0 | 1 | 0 | 1 | 0 | 1 |

FIG. 6

| | L- | L+ | DL | LP DATA |
|---|---|---|---|---|
| LV0 | 1 | 1 | 0 | 1 |
| LV1 | 0/1 | 1 | 1 | 1 |
| LV2 | 0 | 0/1 | 0 | 0 |
| LV3-6 | 0 | 0 | 0/1 | 0 |
| LV7 | 0/1 | 0 | 1 | 0 |
| LV8 | 1 | 0/1 | 0 | 1 |
| LV9-12 | 1 | 1 | 0/1 | 1 |
| LV13 | 0/1 | 1 | 1 | 1 |
| LV14 | 0 | 0/1 | 0 | 0 |
| LV15 | 0 | 0 | 1 | 0 |

FIG. 8

MULTI-PASS PROGRAMMING IN MEMORY DEVICES

CROSS-REFERENCE TO RELATED APPLICATIONS

This application claims priority to Chinese Patent Application No. 202410372170.6, filed on Mar. 28, 2024, which is hereby incorporated by reference in its entirety.

TECHNICAL FIELD

The present disclosure relates to memory devices, systems, and methods for multi-pass programming in memory devices.

BACKGROUND

Memory devices, such as NAND flash memory devices, can store more than a single bit of information into each memory cell in multiple levels in order to increase the storage capacity and reduce the cost per bit. Flash memory is a low-cost, high-density, nonvolatile solid-state storage medium that can be electrically erased and reprogrammed. Flash memory includes NOR flash memory and NAND flash memory. Various operations can be performed by flash memories, for example, read, program (write), and erase operations. Multi-pass programming in a memory device involves multiple passes of program operations to improve the efficiency of the process of storing multiple bits in a memory cell of the memory device.

SUMMARY

The present disclosure relates to memory devices, systems, and methods for multi-pass programming in memory devices.

Certain aspects of the subject matter described here can be implemented as a method. The method includes generating level indicator data based on first data, where the first data is to be stored in a memory device based on a first programming operation and a second programming operation. A programming operation is performed to store the level indicator data in a first cell of a memory cell array of the memory device. The first programming operation is performed to store the first data in a second cell of the memory cell array of the memory device.

The method can include one or more of the following features.

In some implementations, the level indicator data is stored in one or more internal latches of a page buffer of the memory device before the programming operation is performed to store the level indicator data in the first cell.

In some implementations, the first data is stored in the one or more internal latches of the page buffer of the memory device before the programming operation is performed to store the level indicator data in the first cell and before the first programming operation is performed to store the first data in the second cell.

In some implementations, generating the level indicator data based on the first data includes generating the level indicator data based on parity information of the first data.

In some implementations, performing the programming operation includes performing the programming operation to store the level indicator data in a single-level cell (SLC) mode.

In some implementations, after the first programming operation is performed, the level indicator data is read from the memory cell array, the first data is retrieved by reading the first data from the memory cell array, second data is generated based on the level indicator data and the retrieved first data, and the second programming operation is performed to store the second data in the memory cell array of the memory device.

In some implementations, retrieving the first data by reading the first data from the memory cell array includes performing a first read operation of the second cell using a first set of read voltages to generate third data, and performing a second read operation of the second cell using a second set of read voltages to generate fourth data, and generating the second data based on the level indicator data and the retrieved first data includes generating the second data based on the level indicator data, the third data, and the fourth data.

In some implementations, the first cell and the second cell are coupled to a same bit line of the memory cell array.

In some implementations, the level indicator data and the first data are programmed into different pages of a same block of the memory cell array.

In some implementations, the level indicator data and the first data are programmed into different blocks of a same plane of the memory cell array.

Certain aspects of the subject matter described here can be implemented as a memory device. The memory device includes a memory cell array and a peripheral circuit coupled to the memory cell array and configured to perform operations including generating level indicator data based on first data, where the first data is to be stored in the memory device based on a first programming operation and a second programming operation, performing a programming operation to store the level indicator data in a first cell of the memory cell array of the memory device, and performing the first programming operation to store the first data in a second cell of the memory cell array of the memory device.

The memory device can include one or more of the following features.

In some implementations, the level indicator data is stored in one or more internal latches of a page buffer of the memory device before the programming operation is performed to store the level indicator data in the first cell.

In some implementations, the first data is stored in the one or more internal latches of the page buffer of the memory device before the programming operation is performed to store the level indicator data in the first cell and before the first programming operation is performed to store the first data in the second cell.

In some implementations, generating the level indicator data based on the first data includes generating the level indicator data based on parity information of the first data.

In some implementations, the first cell and the second cell are coupled to a same bit line of the memory cell array.

In some implementations, the level indicator data and the first data are programmed into different pages of a same block of the memory cell array.

In some implementations, the level indicator data and the first data are programmed into different blocks of a same plane of the memory cell array.

Certain aspects of the subject matter described here can be implemented as a memory system. The memory system includes a memory device and a controller coupled to the memory device and configured to send one or more signals to the memory device to initiate operations. The memory device includes a memory cell array and a peripheral circuit coupled to the memory cell array and configured to perform the operations comprising: generating level indicator data based on first data, wherein the first data is to be stored in the memory device based on a first programming operation and a second programming operation; performing a programming operation to store the level indicator data in a first cell of the memory cell array of the memory device; and performing the first programming operation to store the first data in a second cell of the memory cell array of the memory device.

The memory system can include one or more of the following features.

In some implementations, the controller is configured to perform one or more operations including: sending a first signal to the memory device to initiate the programming operation to store the level indicator data and to initiate the first programming operation to store the first data, sending a second signal to the memory device to initiate a read operation to read second data from the memory device, where the second data is generated by the memory device using the level indicator data and the first data, and sending a third signal to the memory device to initiate the second programming operation to store the second data.

In some implementations, the controller further includes a decoder and an encoder, and the one or more operations further include: receiving the second data from the memory device after sending the second signal to the memory device to initiate the read operation to read the second data, decoding the second data using the decoder, and encoding the decoded second data into fifth data using the encoder, where sending the third signal to the memory device to initiate the second programming operation to store the second data includes sending the third signal to the memory device to initiate a program operation to store the fifth data in the memory device.

The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

FIG. 6 illustrates a piece of 4-bits data, according to some aspects of the present disclosure.

FIG. 8 illustrates an example of DL, L−, L+, and the regenerated LP data, according to some aspects of the present disclosure.

Like reference numbers and designations in the various drawings indicate like elements.

DETAILED DESCRIPTION

This specification relates to memory devices, systems, and methods for multi-pass programming in memory devices. In some cases, multi-pass programming can be used to store multiple bits of information in a memory cell of a memory device. For example, to store N bits of information in a memory cell, a coarse programming operation can be performed to coarsely store the N-bits data, followed by a fine programming operation to accurately store the N-bits data. The fine programming operation needs to have access to the N-bits data. The disclosed methods and systems can regenerate the N-bits data after the coarse programming operation, without caching the N-bits data before the fine programming operation. The disclosed method generates, during the coarse programming operation, a level indicator data corresponding to the N-bits data, and uses the level indicator data, together with data read back from the coarse programmed data in the memory device, to regenerate the N-bits data for the fine programming operation.

Implementations of the present disclosure can provide one or more of the following technical advantages. For example, data is not cached between two program passes during a multi-pass programming operation to store multiple bit information in a memory cell. As such, write buffer (system cache) is free during subsequent program passes in a multi-pass programming operation. Consequently, storage resources can be saved. Additionally, the implementations of the present disclosure are fully compatible with existing flash memory hardware and firmware for multi-pass programming. Moreover, the disclosed methods can handle power loss cases in memory devices with reduced storage cost. The disclosed methods also have the benefit of not increasing the margin errors of existing read operations.

Figure 1:
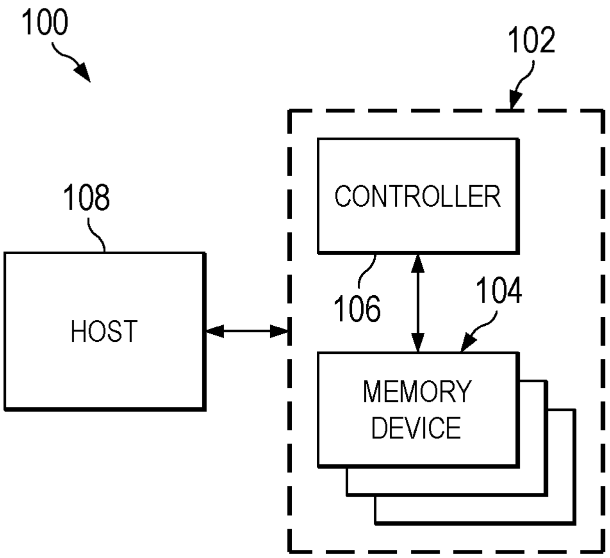
FIG. 1 illustrates a block diagram of an example system having a memory device, according to some aspects of the present disclosure.

FIG. 1 illustrates a block diagram of an example system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104.

Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example, memory controller 106 and a single memory device 104 may be integrated into a memory card that can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. The memory card can further include a memory card connector coupling the memory card with a host (e.g., host 108 in FIG. 1). In another example, memory controller 106 and multiple memory devices 104 may be integrated into an SSD that can further include an SSD connector coupling the SSD with a host (e.g., host 108 in FIG. 1). In some implementations, the storage capacity and/or the operation speed of the SSD is greater than those of the memory card.

In some implementations, a memory cell in memory device 104 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

Figure 2:
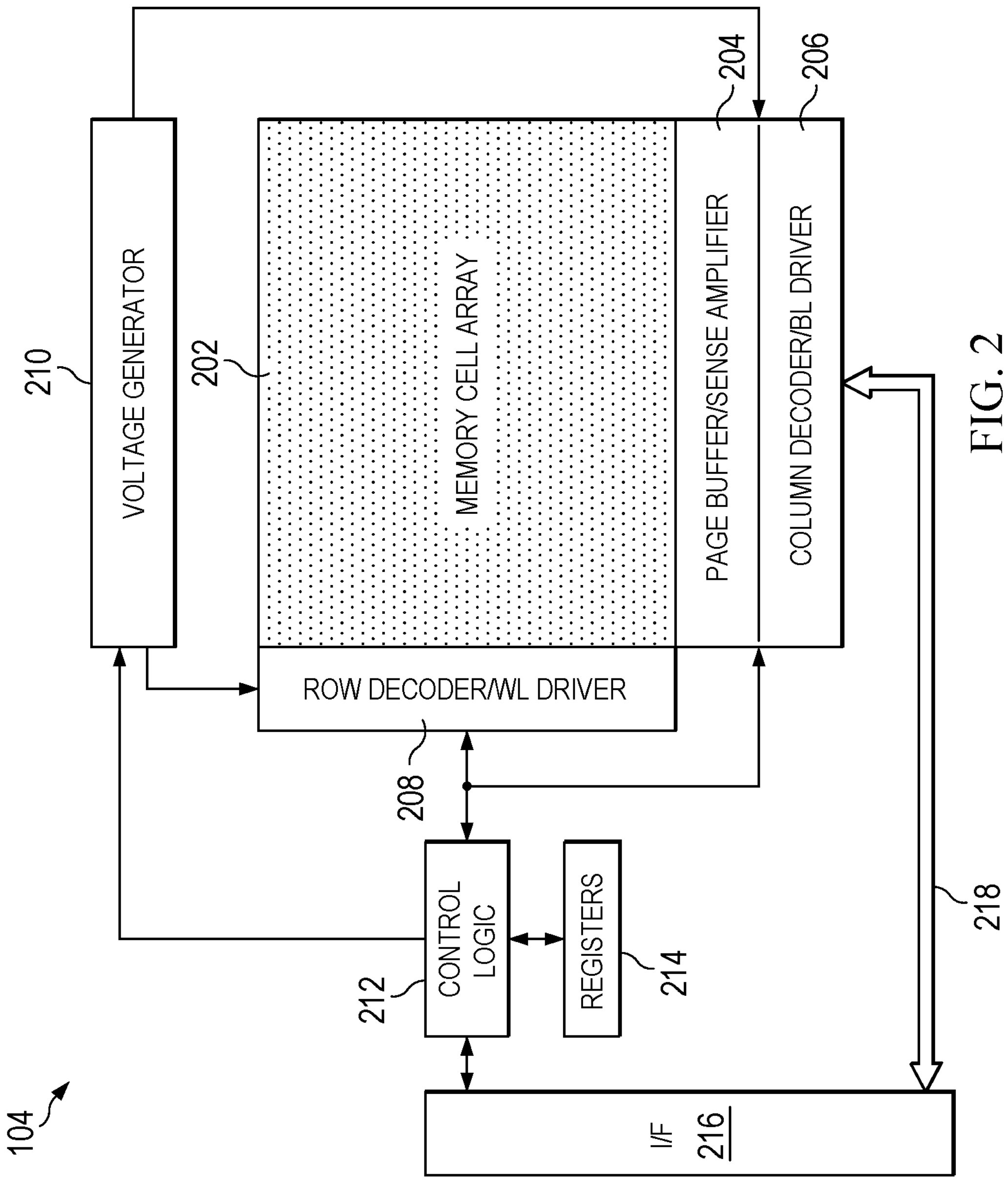
FIG. 2 illustrates an example memory device that includes some example peripheral circuits and a memory cell array, according to some aspects of the present disclosure.

FIG. 2 illustrates an example memory device 104 that includes some example peripheral circuits and a memory cell array 202, according to some aspects of the present disclosure. The example peripheral circuits can include any suitable analog, digital, and mixed-signal circuits for facilitating the operations of memory cell array 202 by applying and sensing voltage signals and/or current signals to and from each target memory cell in memory cell array 202. As shown in FIG. 2, the example peripheral circuits can include a page buffer/sense amplifier 204, a column decoder/bit line driver 206, a row decoder/word line driver 208, a voltage generator 210, control logic 212, registers 214, an interface 216, and a data bus 218. In some examples, additional peripheral circuits not shown in FIG. 2 may be included as well.

Page buffer/sense amplifier 204 can be configured to read and program (write) data from and to memory cell array 202 according to the control signals from control logic 212. In one example, page buffer/sense amplifier 204 may store one page of program data (write data) to be programmed into one page of memory cell array 202. In another example, page buffer/sense amplifier 204 may perform program verify operations to ensure that the data has been properly programmed into memory cells of memory cell array 202. In still another example, page buffer/sense amplifier 204 may also sense the low power signals from a bit line that represents a data bit stored in a memory cell and amplify the small voltage swing to recognizable logic levels in a read operation. Column decoder/bit line driver 206 can be configured to be controlled by control logic 212 and select one or more NAND memory strings by applying bit line voltages generated from voltage generator 210.

Row decoder/word line driver 208 can be configured to be controlled by control logic 212 and select/deselect blocks of memory cell array 202 and select/deselect word lines of blocks of memory cell array 202. Row decoder/word line driver 208 can be further configured to drive word lines using word line voltages generated from voltage generator 210. In some implementations, row decoder/word line driver 208 can also select/deselect and drive source select gate (SSG) lines and drain select gate (DSG) lines as well. Row decoder/word line driver 208 can be configured to apply a read voltage to a selected word line in a read operation on a memory cell coupled to the selected word line.

Voltage generator 210 can be configured to be controlled by control logic 212 and generate the word line voltages (e.g., read voltage, program voltage, pass voltage, local voltage, verification voltage, etc.), bit line voltages, and source line voltages to be supplied to memory cell array 202.

Control logic 212 can be coupled to each peripheral circuit described above and configured to control operations of each peripheral circuit. Registers 214 can be coupled to control logic 212 and include status registers, command registers, and address registers for storing status information, command operation codes (OP codes), and command addresses for controlling the operations of each peripheral circuit. The status registers of registers 214 can include one or more registers configured to store open block information indicative of the open block(s) of all blocks in memory cell array 202, such as having an auto dynamic start voltage (ADSV) list. In some implementations, the open block information is also indicative of the last programmed page of each open block.

Interface 216 can be coupled to control logic 212 and act as a control buffer to buffer and relay control commands received from a host (e.g., host 108 in FIG. 1) to control logic 212 and status information received from control logic 212 to the host. Interface 216 can also be coupled to column decoder/bit line driver 206 via a data bus 218 and act as a data input/output (I/O) interface and a data buffer to buffer and relay the data to and from memory cell array 202.

In some implementations, in program operations, page buffer/sense amplifier 204 can include storage modules (e.g., latches) for temporarily storing a piece of N-bits data (e.g., in the form of gray codes) received from data bus 218 and providing the piece of N-bits data to a corresponding target memory cell in a first pass (a non-last program pass, e.g., a coarse program pass) of a multi-pass program operation. Prior to a second pass after the first pass (the last program pass, e.g., a fine program pass), in a read operation, page buffer/sense amplifier 204 can be configured to read one or more (M) bits of the piece of N-bits data based on the corresponding intermediate level in which the target memory cell is programmed into the first pass and also receive the remaining (N-M) bits of the piece of N-bits data from a memory controller (e.g., 106 in FIG. 1). Page buffer/sense amplifier 204 can then be configured to combine the read bits and the received bits into the corresponding piece of N-bits data and provide the corresponding piece of N-bits data to the target memory cell in the second pass. Therefore, in these implementations, the remaining (N-M) bits of the piece of N-bits data need to be received from a memory controller.

Figure 3:
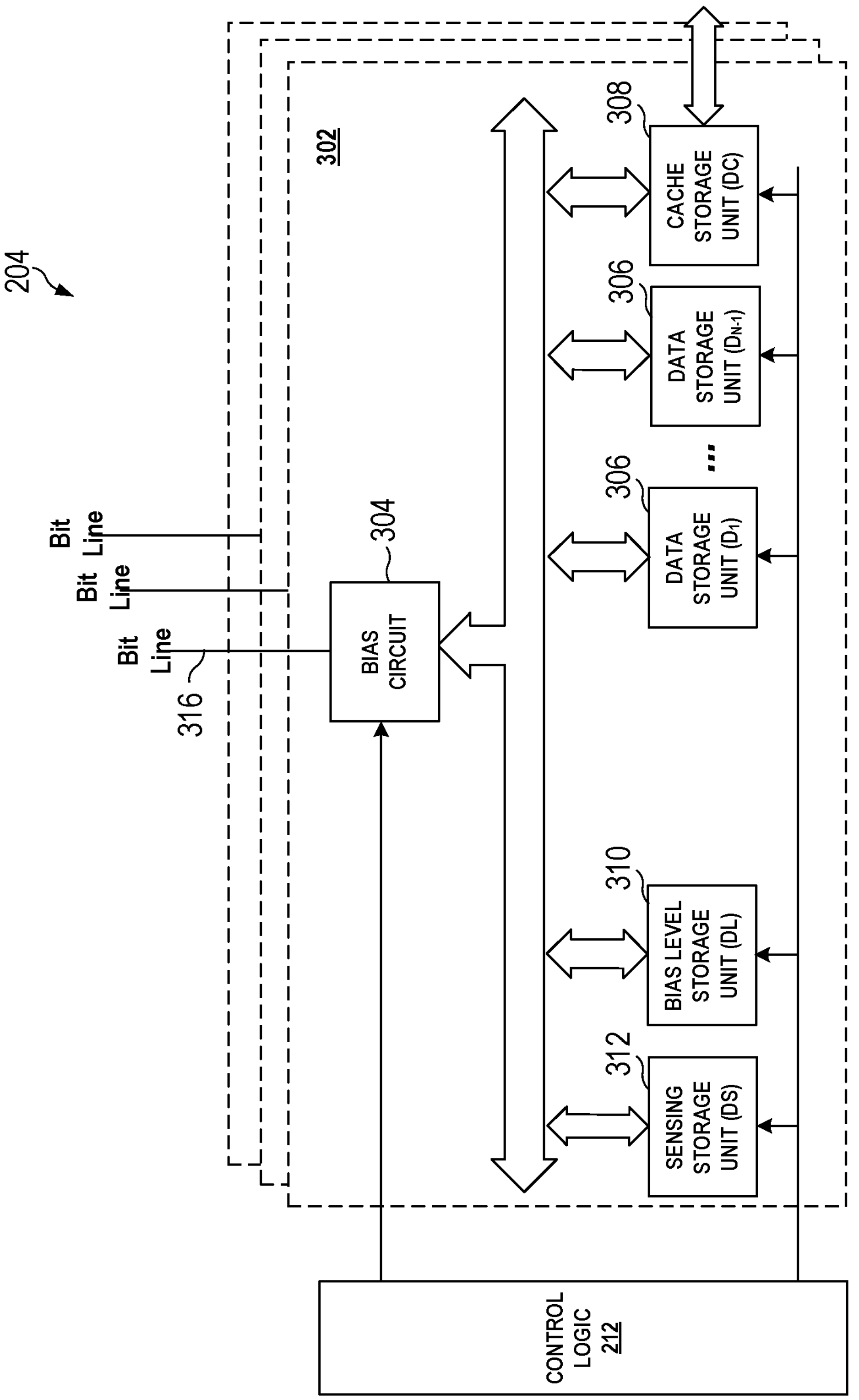
FIG. 3 illustrates a detailed block diagram of an example structure of a page buffer, according to some aspects of the present disclosure.

FIG. 3 illustrates a detailed block diagram of an example structure of a page buffer (e.g., page buffer/sense amplifier 204), according to some aspects of the present disclosure. In some implementations, the page buffer in FIG. 3 includes a plurality of page buffer circuits 302 each coupled to a respective one of bit lines 316. In other words, each page buffer circuit 302 can be coupled to a respective column of memory cells through a corresponding bit line 316 and configured to temporarily store a set of N-bits data that is used for programming a respective select memory cell in a program operation. All page buffer circuits 302 in the page buffer together can temporarily store the entire current data page (e.g., Q sets of the N-bits data) that are used for programming a select row of memory cells coupled to a select word line in the program operation. As described above, in some implementations, each page buffer circuit 302 is also configured to pre-process a respective portion of the user data received from data bus 218 and convert it to the corresponding set of N-bits data based on a preset gray code. The corresponding set of N-bits data may include N portions of page data (e.g., N bits from the current data page). For example, for TLCs where N=3, each page buffer circuit 302 may be configured to temporarily store a respective set of the 8 sets of 3 bits of the current data page, where the respective set corresponds to one of 8 levels.

In some implementations, each page buffer circuit 302 can include a plurality of non-dynamic storage units and a bias circuit 304. The plurality of non-dynamic storage units may include N−1 data storage units ($D_1, \ldots, D_{N-1}$) 306, a cache storage unit (DC) 308, a bias level storage unit (DL) 310, and a sensing storage unit (DS) 312.

It is understood that each non-dynamic storage unit (such as data storage unit 306, cache storage unit 308, bias level storage unit 310, and sensing storage unit 312) may be any circuit that has two stable states for storing a single bit of data, such as a latch or a flip-flop. In some implementations, each of data storage unit 306, cache storage unit 308, bias level storage unit 310, and sensing storage unit 312 may include a latch. For example, page buffer circuit 302 may have a 4-latch configuration that includes one cache latch, one data latch, one 3-bias-level (3BL) latch, and one sensing latch for a TLC memory device. In another example, page buffer circuit 302 may have a 5-latch configuration that includes one cache latch, two data latches, one 3-bias-level latch, and one sensing latch for a QLC memory device.

During a current program operation for programming a select row of memory cells based on a current data page, each of N−1 data storage units 306 can be configured to store a respective portion of page data from the set of the N-bits data (e.g., a respective bit of the corresponding N bits from the current data page). As a result, N−1 data storage units 306 can store N−1 portions of page data from the set of the N-bits data (e.g., N−1 bits of the corresponding N bits from the current data page).

To reduce the number of non-dynamic storage units and the size of page buffer circuit 302, the number of cache storage unit 308 is limited to one, i.e., a single cache storage unit 308 that can store only a single bit of data at the same time, according to some implementations. In some cases, the number of data storage units in each page buffer circuit 302 can be at least the same as the number of bits in the set of N-bits data used for programming the corresponding select memory cell, i.e., N data storage units, because the single cache storage unit is dedicated to caching the data of the next data page. In some other cases, the single cache storage unit 308 in page buffer circuit 302 in FIG. 3 can also be configured to store one of the corresponding N bits from the current data page. That is, cache storage unit 308 is configured to sequentially store one of the corresponding N bits from the current data page and each of the corresponding N bits from the next data page, according to some implementations. In other words, cache storage unit 308 can act as both a data storage unit and a cache storage unit in a time-division manner to replace one of data storage units 306 in each page buffer circuit 302. Additionally, bias level storage unit 310 may be configured to store another one of the corresponding N bits from the current data page.

In some implementations, another storage unit in each page buffer circuit 302 for storing non-data page information is configured to sequentially store the non-data page information and one of the N bits of the next data page, thereby enabling the caching of all N−1 bits of the next data page in the current program operation to avoid the data loading windows. That is, page buffer circuit 302 can include a multipurpose storage unit that can store the non-data page information and cache the data of the next data page in a time-division manner. For example, sensing storage unit (DS) 312 or bias level storage unit (DL) 310 may be configured to store non-data page information, i.e., any information other than the data bits in a data page.

For example, sensing storage unit (DS) 312 may be configured to store information indicative of whether the current operation performed by page buffer/sense amplifier 204 is a read operation or a program operation. Bias level storage unit (DL) 310 (e.g., a 3-bias-level storage unit) may be configured to store the bias information of the respective bit line 316 coupled to page buffer circuit 302. In some implementations, bias level storage unit 310 may be a multipurpose storage unit that acts as both a bias level storage unit and a data storage unit in a time-division manner. Bias circuit 304 may be coupled to a respective bit line 316 and configured to apply a bit line voltage to corresponding select memory cell coupled to a respective bit line 316 in the program operation. Depending on whether the corresponding select memory cell passes the verification at the respective level according to the N bits of data for programming the select memory cell, for example, a high voltage level and a low voltage level, can be used as a bias level to determine a bit line voltage to be applied to the respective bit line 316 in a next program operation. In some implementations, to optimize the threshold voltage distributions, for example, enlarging the read margins between adjacent levels and reducing the width of each level, a medium voltage level is also used as the bias level to determine the bit line voltage in the next program operation. That is, one of three voltage levels, e.g., high, medium, and low (referred to herein as 3-bias-level), can be used as the bias level to determine the bit line voltage applied to the respective bit line 316 in the next program operation. In some implementations, the bias level is non-data page information stored in bias level storage unit 310.

It is understood that although bias level storage unit 310 is described herein as an example of the multipurpose storage unit, any suitable non-data page storage units in page buffer circuit 302, such as sensing storage unit 312, or any other non-data page storage units not shown in FIG. 3, may be used as the multipurpose storage unit in some examples without adding additional storage units into page buffer circuit 302.

In some implementations, control logic 212 may be configured to determine a type of an operation to be performed on page buffer circuit 302.

Figure 4:
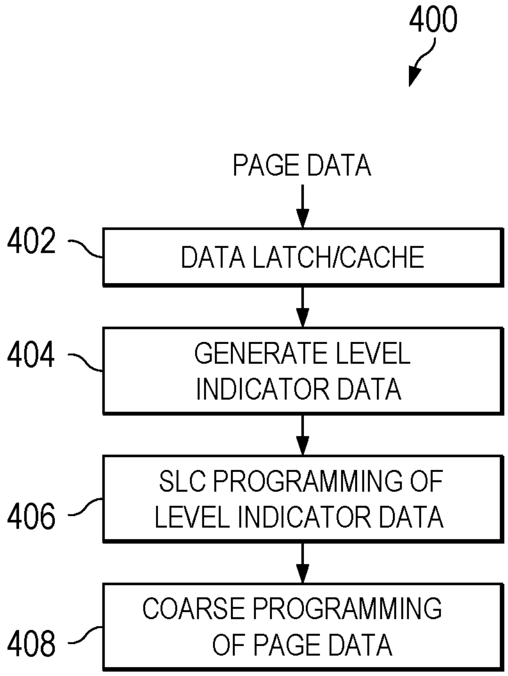
FIG. 4 illustrates an example process for coarse programming of N pages of data corresponding to a piece of N-bits data, according to some aspects of the present disclosure.

FIG. 4 illustrates an example process 400 for coarse programming of N pages of data (e.g., first data) corresponding to a piece of N-bits data (having 2~ values), according to some aspects of the present disclosure. In some implementations, the coarse programming of the N pages of data is a first pass (a non-last program pass) in a two-pass program operation of the N pages of data to store the N pages of data into a memory cell array, for example, memory cell array 202 in FIG. 2.

At 402, a set of peripheral circuits of a memory device, for example, the example peripheral circuits of memory device 104 shown in FIG. 2, caches the N pages of data in internal data latches of a page buffer, for example, the $D_1, \ldots, D_{N-1}$, and DC latches in page buffer 302 in FIG. 3.

At 404, the set of peripheral circuits generates 1 page of a piece of level indicator data corresponding to the N pages of data (i.e., the piece of N-bits data). For example, FIG. 6 illustrates a piece of 4-bits data (having 16 values and in the form of gray codes), according to some aspects of the present disclosure. For each of the 16 values, a level indicator DL is generated as a parity check of the corresponding 4 bits of binary values (i.e., LP, MP, UP, and XP). As an example, for the LV0 value of (1,1,1,1) in FIG. 6, the level indicator DL is 0, which is the parity check of (1,1,1,1). In some implementations, the 1 page of the piece of level indicator data can be temporarily stored at an internal latch of the page buffer, for example, bias level storage unit (DL) 310 in FIG. 3 configured to store 3BL bias information.

At 406, the set of peripheral circuits performs single-level cell (SLC) programming (e.g., programming operation) of the 1 page of the piece of level indicator data to store the piece of level indicator data into memory cells (e.g., first cells) with pre-defined addresses in the memory cell array.

At 408, the set of peripheral circuits performs a multi-level cell based, for example, QLC based (if N=4), coarse programming (e.g., first programming operation) of the N pages of data to store the N pages of data in memory cells (e.g., second cells) of the memory cell array. In some implementations, the piece of level indicator data can be stored in the same plane to be used to store the N pages of data, but in a block different than the block to be used to store the N pages of data. In some cases, the piece of level indicator data can be stored in the same block used to store the N pages of data, but in a page different than the pages used to store the N pages of data. In some cases, the piece of level indicator data and the N pages of data can be stored in memory cells that are coupled to the same word line or the same bit line.

Figure 5:
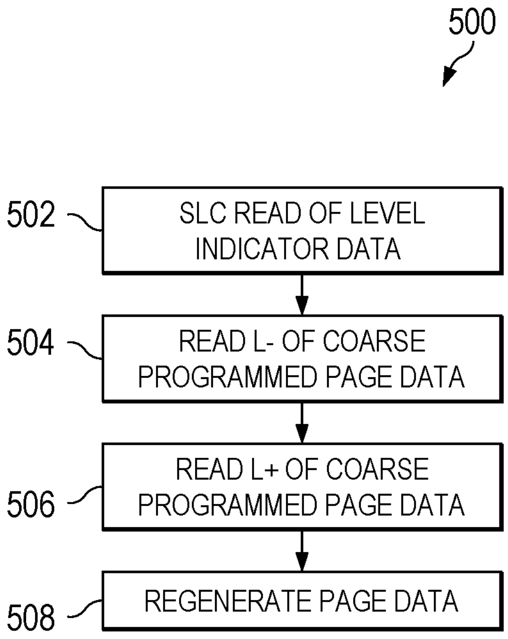
FIG. 5 illustrates an example process for reconstructing the N pages of data from the stored level indicator data and the coarse programmed N pages of data, according to some aspects of the present disclosure.

FIG. 5 illustrates an example process 500 for reconstructing the N pages of data from the stored level indicator data and the coarse programmed N pages of data, according to some aspects of the present disclosure. In some implementations, after the N pages of data are reconstructed, the set of peripheral circuits can perform fine programming (e.g., second programming operation) of the reconstructed N pages of data (e.g., second data). The fine programming of the reconstructed N pages of data can be a second pass after the first pass (e.g., the last program pass) in the two-pass program operation of the N pages of data to store the N pages of data into the memory cell array. With the N pages of data reconstructed from the stored level indicator data and the coarse programmed N pages of data, the set of peripheral circuits does not need to get from controller 106 the N pages of data after the coarse programming of the N pages of data and before the fine programming of the N pages of data. Consequently, storage resources at controller 106 can be saved.

At 502, the set of peripheral circuits performs SLC read of the piece of level indicator data DL stored in the memory cell array, for example, the piece of level indicator data DL in FIG. 8.

At 504, the set of peripheral circuits performs a multi-level cell based, for example, QLC based (if N=4), first read operation to read, as L− (e.g., third data), the coarse programmed N pages of data from the memory cell array. In some implementations, given a set of gray codes representing a piece of N-bits data corresponding to the N pages of data, to read, during the first read operation, the $n^{th}$ value of the $2^N$ values corresponding to the piece of N-bits data, the set of peripheral circuits sets the read voltage to a first value (e.g., first set of read voltages) equivalent to the center of the threshold voltage distribution of the $(n-1)^{th}$ value of the $2^N$ values.

At 506, the set of peripheral circuits performs a multi-level cell based, for example, QLC based (if N=4), second read operation to read, as L+ (e.g., fourth data), the coarse programmed N pages of data from the memory cell array. In some implementations, given the set of gray codes representing the piece of N-bits data corresponding to the N pages of data, to read, during the second read operation, the $n^{th}$ value of the $2^N$ values corresponding to the piece of N-bits data, the set of peripheral circuits sets the read voltage to a second value (e.g., second set of read voltages) equivalent to the center of the threshold voltage distribution of the $n^{th}$ value of the $2^N$ values.

Figure 7:
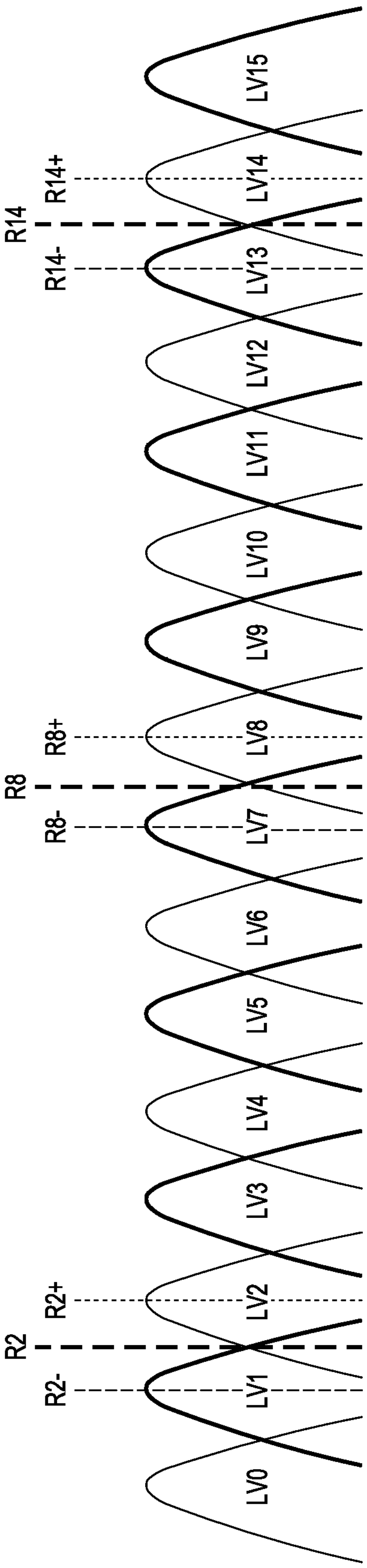
FIG. 7 illustrates example read voltages in reading L− and L+, according to some aspects of the present disclosure.

FIG. 7 illustrates example read voltages in reading L− and L+ described in 504 and 506 above, according to some aspects of the present disclosure. FIG. 7 is for setting the read voltages to read L− and L+ in order to reconstruct the LP data shown in FIG. 6. For example, to perform the first read operation to read the third value (i.e., LV2) of the 16 values of a piece of 4-bits data, the set of peripheral circuits sets the read voltage R2− to the center of the threshold voltage distribution of the second value (i.e., LV1) of the 16 values. As another example, to perform the second read operation to read the third value (i.e., LV2) of the 16 values of the piece of 4-bits data, the set of peripheral circuits sets the read voltage R2+ to the center of the threshold voltage distribution of the third value (i.e., LV2) of the 16 values. The read voltages can be similarly set for R8−, R8+, R14−, and R14+, as shown in FIG. 7.

Returning to FIG. 5, at 508, the set of peripheral circuits regenerates the N pages of data by combining the piece of level indicator data DL read at 502, L− read at 504, and L+ read at 506 by performing the logical operation of ~DL&L−+DL&L+.

FIG. 8 illustrates an example of DL, L−, L+, and the regenerated LP data, according to some aspects of the present disclosure. The original LP data in 4 pages of data (LP, MP, UP, and XP) is shown in FIG. 6. As described at 508 above, the set of peripheral circuits obtains the regenerated LP data by performing the logical operation of ~DL&L−+DL&L+. FIG. 8 shows that the regenerated LP data in the last column in FIG. 8 matches the LP data in FIG. 6. In some implementations, MP, UP, and XP data can be regenerated in a way similar to that for regenerating LP data shown in FIG. 8. When regenerating each of the MP, UP, and XP data, the corresponding L− and L+ can be different than the L− and L+ shown in FIG. 8, and can be obtained from the gray code associated with the piece of N-bits data for the LP, MP, UP, and XP data, for example, the gray code in FIG. 6. The logical operation used to regenerate each of the MP, UP, and XP data can be the same as or different than the logical operation described above for the LP data.

Figure 9:
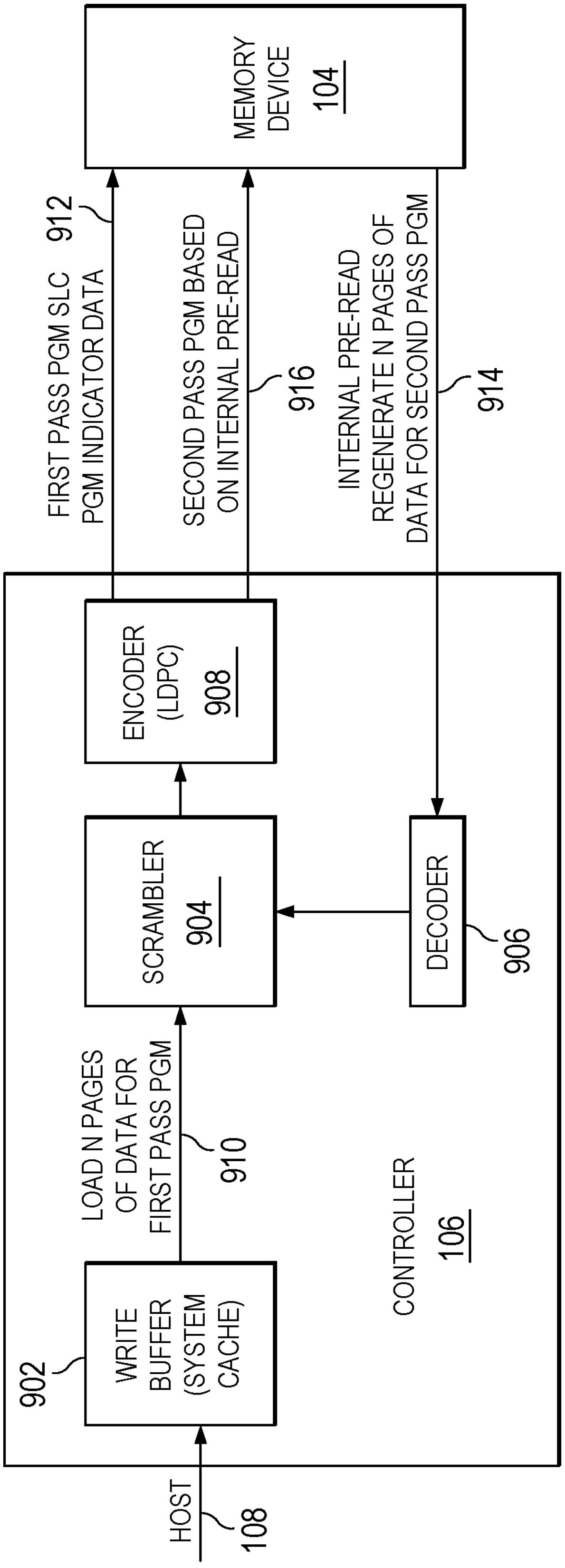
FIG. 9 illustrates an example workflow for performing a two-pass program operation of N pages of data, according to some aspects of the present disclosure.

FIG. 9 illustrates an example workflow for performing a two-pass program operation of N pages of data, according to some aspects of the present disclosure. At 910, controller 106 loads the N pages of data from write buffer (system cache) 902 to scrambler 904 in preparation for the first pass programming (e.g., coarse programming). The scrambled N pages of data then pass through encoder 908 for low density parity check (LDPC).

At 912, memory device 104 generates, for example, according to 404 in FIG. 4, the level indicator data based on the encoded N pages of data from encoder 908, then performs SLC based programming of the level indicator data to store the level indicator data in memory device 104. Next, memory device 104 performs the first pass programming (e.g., coarse programming) of the encoded N pages of data from encoder 908 to store the encoded N pages of data in memory device 104.

At 914, memory device 104 can regenerate, for example, according to 502 to 508, the N pages of data in preparation for the second pass programming (e.g., fine programming) of the N pages of data, by internally pre-reading and combining the level indicator data stored in memory device 104 and the coarse programmed N pages of data stored in memory device 104.

The regenerated N pages of data then passes through decoder 906, scrambler 904, and encoder 908 in controller 106. At 916, memory device 104 performs the second pass programming (e.g., fine programming) of the encoded regenerated N pages of data from encode 908 to store, as the encoded N pages of data, the encoded regenerated N pages of data in memory device 104.

Figure 10:
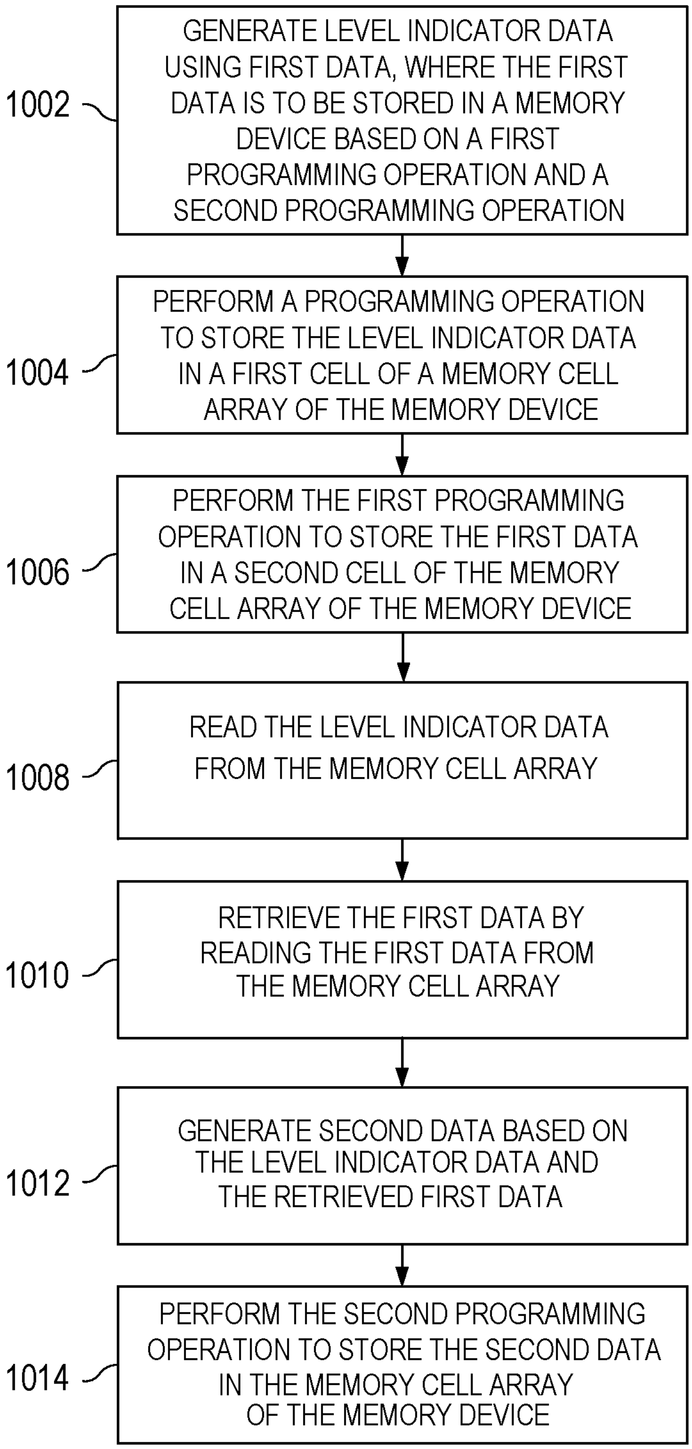
FIG. 10 illustrates an example of a flow chart of a method for multi-pass programming in a memory device, according to some aspects of the present disclosure.

FIG. 10 illustrates an example of a flow chart of a method for multi-pass programming in a memory device, according to some aspects of the present disclosure. At 1002, a peripheral circuit of the memory device generates level indicator data based on first data, where the first data is to be stored in a memory device based on a first programming operation and a second programming operation.

At 1004, the peripheral circuit performs a programming operation to store the level indicator data in a first cell of a memory cell array of the memory device.

At 1006, the peripheral circuit performs the first programming operation to store the first data in a second cell of the memory cell array of the memory device.

At 1008, the peripheral circuit reads the level indicator data from the memory cell array.

At 1010, the peripheral circuit retrieves the first data by reading the first data from the memory cell array.

At 1012, the peripheral circuit generates second data based on the level indicator data and the retrieved first data.

At 1014, the peripheral circuit performs the second programming operation to store the second data in the memory cell array of the memory device.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any subcombination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the subranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A method, comprising:

generating level indicator data based on first data, wherein the first data is to be stored in a memory device based on a first programming operation and a second programming operation;

performing a programming operation to store the level indicator data in a first cell of a memory cell array of the memory device;

performing the first programming operation to store the first data in a second cell of the memory cell array of the memory device;

reading the level indicator data from the first cell of the memory cell array;

retrieving the first data by reading the first data from the second cell of the memory cell array;

generating second data based on the read level indicator data and the retrieved first data; and performing the second programming operation to store the second data in the second cell of the memory cell array.

2. The method according to claim 1, wherein the method further comprises:

storing the level indicator data in one or more internal latches of a page buffer of the memory device before performing the programming operation to store the level indicator data in the first cell.

3. The method according to claim 2, wherein the method further comprises:

storing the first data in the one or more internal latches of the page buffer of the memory device before performing the programming operation to store the level indicator data in the first cell and before performing the first programming operation to store the first data in the second cell.

4. The method according to claim 1, wherein generating the level indicator data based on the first data comprises generating the level indicator data based on parity information of the first data.

5. The method according to claim 1, wherein performing the programming operation comprises performing the programming operation to store the level indicator data in a single-level cell (SLC) mode.

6. The method according to claim 1, wherein retrieving the first data by reading the first data from the memory cell array comprises:

performing a first read operation of the second cell using a first set of read voltages to generate third data; and performing a second read operation of the second cell using a second set of read voltages to generate fourth data; and wherein generating the second data based on the level indicator data and the retrieved first data comprises generating the second data based on the level indicator data, the third data, and the fourth data.

7. The method according to claim 1, wherein the first cell and the second cell are coupled to a same bit line of the memory cell array.

8. The method according to claim 1, wherein the level indicator data and the first data are programmed into different pages of a same block of the memory cell array.

9. The method according to claim 1, wherein the level indicator data and the first data are programmed into different blocks of a same plane of the memory cell array.

10. A memory device, comprising:

a memory cell array; and a peripheral circuit coupled to the memory cell array and configured to perform operations comprising:

generating level indicator data based on first data, wherein the first data is to be stored in the memory device based on a first programming operation and a second programming operation;

performing a programming operation to store the level indicator data in a first cell of the memory cell array of the memory device;

performing the first programming operation to store the first data in a second cell of the memory cell array of the memory device;

reading the level indicator data from the first cell of the memory cell array;

retrieving the first data by reading the first data from the second cell of the memory cell array;

generating second data based on the read level indicator data and the retrieved first data; and performing the second programming operation to store the second data in the second cell of the memory cell array.

11. The memory device according to claim 10, wherein the operations further comprise:

storing the level indicator data in one or more internal latches of a page buffer of the memory device before performing the programming operation to store the level indicator data.

12. The memory device according to claim 11, wherein the operations further comprise:

storing the first data in the one or more internal latches of the page buffer of the memory device before performing the programming operation to store the level indicator data in the first cell and before performing the first programming operation to store the first data in the second cell.

13. The memory device according to claim 10, wherein generating the level indicator data based on the first data comprises generating the level indicator data based on parity information of the first data.

14. The memory device according to claim 10, wherein the first cell and the second cell are coupled to a same bit line of the memory cell array.

15. The memory device according to claim 10, wherein the level indicator data and the first data are programmed into different pages of a same block of the memory cell array.

16. The memory device according to claim 10, wherein the level indicator data and the first data are programmed into different blocks of a same plane of the memory cell array.

17. A memory system, comprising:

a memory device, comprising:

a memory cell array; and a peripheral circuit coupled to the memory cell array and configured to perform operations comprising:

generating level indicator data based on first data, wherein the first data is to be stored in the memory device based on a first programming operation and a second programming operation;

performing a programming operation to store the level indicator data in a first cell of the memory cell array of the memory device;

performing the first programming operation to store the first data in a second cell of the memory cell array of the memory device;

retrieving the first data by reading the first data from the second cell of the memory cell array;

generating second data based on the read level indicator data and the retrieved first data; and performing the second programming operation to store the second data in the second cell of the memory cell array; and a controller coupled to the memory device and configured to send one or more signals to the memory device to initiate the operations.

18. The memory system according to claim 17, wherein the controller is configured to perform one or more operations comprising:

sending a first signal to the memory device to initiate the programming operation to store the level indicator data and to initiate the first programming operation to store the first data;

sending a second signal to the memory device to initiate a read operation to read second data from the memory device, wherein the second data is generated by the memory device using the level indicator data and the first data; and sending a third signal to the memory device to initiate the second programming operation to store the second data.

19. The memory system according to claim 18, wherein the controller further comprises a decoder and an encoder, and the one or more operations further comprise:

receiving the second data from the memory device after sending the second signal to the memory device to initiate the read operation to read the second data;

decoding the second data using the decoder; and encoding the decoded second data into fifth data using the encoder, wherein sending the third signal to the memory device to initiate the second programming operation to store the second data comprises sending the third signal to the memory device to initiate a program operation to store the fifth data in the memory device.

* * * * *